US012687889B2

(12) United States Patent (10) Patent No.: US 12,687,889 B2
Song et al. (45) Date of Patent: Jul. 21, 2026

(54) ELECTRONIC DEVICE AND METHOD FOR ASSEMBLING ELECTRONIC DEVICE

(71) Applicant: Huawei Technologies Co., Ltd., Shenzhen (CN)

(72) Inventors: Yao Song, Xi'an (CN); Xingguo Hu, Shanghai (CN); Defu Shi, Dongguan (CN); Hongwei Du, Xi'an (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 135 days.

(21) Appl. No.: 18/564,893

(22) PCT Filed: Apr. 8, 2022

(86) PCT No.: PCT/CN2022/085677
§ 371 (c)(1),
(2) Date: Nov. 28, 2023

(87) PCT Pub. No.: WO2022/247484
PCT Pub. Date: Dec. 1, 2022

(65) Prior Publication Data
US 2024/0385651 A1 Nov. 21, 2024

(30) Foreign Application Priority Data
May 28, 2021 (CN) .......................... 202110594645.2

(51) Int. Cl.
*G06F 1/16* (2006.01)
*H05K 5/02* (2006.01)

(52) U.S. Cl.
CPC ......... *G06F 1/1637* (2013.01); *H05K 5/0217* (2013.01)

(58) Field of Classification Search
CPC ....................................................... H05K 5/02
See application file for complete search history.

(56) References Cited

U.S. PATENT DOCUMENTS

| | | | |
|---|---|---|---|
| 10,598,974 B2 | 3/2020 | Shimojo et al. | |
| 2009/0237586 A1* | 9/2009 | Han .................. | G02F 1/133308 |
| | | | 361/679.21 |
| 2013/0050820 A1 | 2/2013 | Shin | |
| 2018/0364515 A1* | 12/2018 | Kim .................. | H05K 7/20963 |
| 2019/0141281 A1 | 5/2019 | Mori et al. | |
| 2021/0103170 A1 | 4/2021 | Kuo et al. | |

FOREIGN PATENT DOCUMENTS

| | | |
|---|---|---|
| CN | 102316294 A | 1/2012 |
| CN | 205050499 U | 2/2016 |
| CN | 106154615 A | 11/2016 |

(Continued)

*Primary Examiner* — Jerry Wu
(74) *Attorney, Agent, or Firm* — Conley Rose, P.C.

(57) ABSTRACT

An electronic device includes a frame body which includes a left frame portion and a right frame portion parallel to each other and connected perpendicular to a top frame portion. Each frame portion includes a front frame wall, a rear frame wall, and a side frame wall. An outer side edge of the front frame wall is connected to an outer side edge of the rear frame wall by the side frame wall, and the outer side edge of the front frame wall is connected to a branch wall extending perpendicular to the front frame wall. A front surface of the front frame wall is configured to support a screen.

20 Claims, 9 Drawing Sheets

(56) References Cited

FOREIGN PATENT DOCUMENTS

| | | | |
|---|---|---|---|
| CN | 109856838 | A | 6/2019 |
| CN | 109996018 | A | 7/2019 |
| CN | 210136382 | U | 3/2020 |
| CN | 210270455 | U | 4/2020 |
| CN | 210666258 | U | 6/2020 |
| CN | 210722202 | U | 6/2020 |
| CN | 211264025 | U | 8/2020 |
| CN | 111816061 | A | 10/2020 |
| CN | 212515271 | U | 2/2021 |
| JP | 2009162922 | A | 7/2009 |

* cited by examiner

ELECTRONIC DEVICE AND METHOD FOR ASSEMBLING ELECTRONIC DEVICE

CROSS-REFERENCE TO RELATED APPLICATIONS

This is a U.S. National Stage of International Patent Application No. PCT/CN2022/085677 filed on Apr. 8, 2022, which claims priority to Chinese Patent Application No. 202110594645.2 filed on May 28, 2021. Both of the aforementioned applications are hereby incorporated by reference in their entireties.

TECHNICAL FIELD

This application relates to the field of terminal technologies, and in particular, to an electronic device and a method for assembling an electronic device.

BACKGROUND

With development of electronic products, consumers pay increasingly more attention to appearance quality of the electronic products. Electronic devices with a screen, especially large-screen products such as televisions, electronic display apparatuses placed in a mall, or electronic display apparatuses used outdoors, gradually develop towards an ultra-thin, frameless, and large-size direction.

An existing electronic device is shown in FIG. 18. A middle frame 01 of the electronic device has a mounting groove with a U-shaped cross section. A rear housing (not shown) cooperates with a rear frame wall of the middle frame 01 to form space for accommodating a screen 02 and a backboard 04 on which an optical module 03 is installed. Edges of both the backboard 04 and the screen 02 are located in the mounting groove of the middle frame 01. The backboard 04 is disposed between the screen 02 and the rear housing. To support and fasten the screen 02, a transition frame 05 is further disposed in the electronic device. The transition frame 05 is located on an inner side of the middle frame 01, and includes a side frame plate 051 parallel to a side frame wall 011 of the middle frame 01 and a support frame plate 052 that is vertically and fixedly connected to the side frame plate 051. The support frame plate 052 is fixedly connected to a side that is of the side frame plate 051 and that is away from the middle frame. The support frame plate 052 is disposed in parallel to the screen 02, and a front surface of the support frame plate 052 is configured to support and fasten the screen 02. The optical module 03 is located on a rear surface of the support frame plate 052.

In the foregoing structure of the electronic device, due to disposing of the transition structure, a front frame wall of the middle frame is large in size to cover an edge of the screen, and a development requirement of an electronic device without a frame cannot be met.

SUMMARY

Embodiments of this application provide an electronic device and a method for assembling an electronic device. A structure design of the electronic device can resolve a problem that a screen frame of an electronic device is large.

A first aspect of embodiments of this application provides an electronic device, including a screen, a middle frame, and an optical module. The middle frame includes a frame body, and the frame body is of a frame structure with an opening on one side, and includes three frame portions. A first frame portion and a second frame portion are disposed in parallel, and same-side ends of the first frame portion and the second frame portion are fixedly connected by using a third frame portion, that is, ends that are of the first frame portion and the second frame portion and that are away from the third frame portion are openings. Each frame portion of the frame body includes a front frame wall, a rear frame wall, and a side frame wall. An outer side edge of the front frame wall is fixedly connected to an outer side edge of the rear frame wall by using the side frame wall, and the outer side edge of the front frame wall is fixedly connected to a branch wall extending forwards. A front surface of the front frame wall is configured to support and fasten the screen. Apparently, three branch walls of the frame body form a frame structure that limits a location of the screen. The optical module is located between the front frame wall and the rear frame wall, that is, a groove structure formed by inserting an edge of the optical module between the front frame wall and the rear frame wall does not interfere with the screen.

In other words, the electronic device includes a screen, a middle frame, and an optical module; the middle frame includes a frame body, and the frame body is of a frame structure with an opening on one side, and includes three frame portions, a first frame portion and a second frame portion are disposed in parallel, and same-side ends of the first frame portion and the second frame portion are fixedly connected by using a third frame portion, that is, ends that are of the first frame portion and the second frame portion and that are away from the third frame portion are opening ends; each frame portion of the frame body includes a first frame wall, a second frame wall, and a third frame wall, the first frame wall and the second frame wall are disposed opposite to each other, and the third frame wall connects a first side edge of the first frame wall and a first side edge of the second frame wall; the first side edge of the first frame wall is a side edge that is on the first frame wall and that is away from a center of the screen, the first side edge of the second frame wall is a side edge that is on the second frame wall and that is away from the center of the screen, the first side edge of the first frame wall is further fixedly connected to a branch wall, and the branch wall extends in a direction away from the second frame wall; a surface that is of the first frame wall and that is away from the second frame wall is configured to support and fasten the screen, and the screen is located in a frame structure enclosed by branch walls, that is, three branch walls of the frame body enclose a frame structure that limits a location of the screen; and the optical module is located between the first frame wall and the second frame wall, that is, a groove structure formed by inserting an edge of the optical module between the first frame wall and the second frame wall does not interfere with the screen.

In the electronic device, a structure of the middle frame is improved, so that both the screen and the optical module can be directly assembled with the middle frame, and disposing of a transition frame is canceled. The screen is supported and fastened by the front frame wall of the middle frame, edge limiting is implemented by using the branch wall of the middle frame, and the branch wall can be designed to be narrow in size, thereby resolving a problem that a size of a screen frame of an existing electronic device is large.

Based on the first aspect, embodiments of this application further provide a first implementation of the first aspect: The electronic device further includes a backboard configured to be assembled with the optical module; the frame body wraps an edge of the backboard, that is, the rear frame wall is located on a rear side of the backboard; and a side edge that is of the backboard and that corresponds to a location of at least one frame portion has a folding edge extending forwards, where the folding edge is located between the front frame wall and the rear frame wall of the frame portion. The electronic device further includes an abutting member and a flexible diaphragm, that is, the diaphragm can be bent; a first part of the diaphragm is fixedly connected to an outer side surface of the folding edge, and abuts against the side frame wall of the frame portion at the corresponding location; a second part of the diaphragm is bent inwards, and is located between the front frame wall of the frame portion at the corresponding location and the optical module; and the abutting member is fixedly connected to the second part of the diaphragm and faces the optical module.

In other words, the electronic device further includes a backboard configured to be assembled with the optical module; the frame body wraps an edge of the backboard, that is, the second frame wall is located on a side that is of the backboard and that is away from the first frame wall; and a side edge of the backboard has a folding edge extending towards a direction in which the first frame wall is located, where the folding edge is located between the first frame wall and the second frame wall of the frame portion. The electronic device further includes an abutting member and a flexible diaphragm, that is, the diaphragm can be bent; a first part of the diaphragm is fixedly connected to a side surface that is of the folding edge and that is away from a center of the electronic device, and abuts against the side frame wall of the frame portion; a second part of the diaphragm is bent towards a center direction of the electronic device, and is located between the front frame wall of the frame portion and the optical module; and the abutting member is fixedly connected to the second part of the diaphragm and faces the optical module.

In this way, the abutting member is fastened to the diaphragm, and through the foregoing disposing of the folding edge of the backboard and the diaphragm, the second part of the diaphragm may be pressed towards the optical module in a process of assembling the frame body and the backboard on which the optical module is installed, so as to prevent the abutting member from falling off or scratching the optical module in the assembly process.

Based on the first implementation of the first aspect, embodiments of this application further provide a second implementation of the first aspect: There is an identifier on the diaphragm, and the identifier is used to delimit the first part and the second part. In this way, it is convenient to assemble the backboard and the diaphragm to which the abutting member is fixedly connected.

Based on the first implementation of the first aspect or the second implementation of the first aspect, embodiments of this application further provide a third implementation of the first aspect: The diaphragm is Mylar. The Mylar (MYLAR) is a thin film, which may be a PET polyester thin film, and is a thin film formed by heating dimethyl terephthalate and ethylene glycol with assistance of a related catalyst, performing transesterification, vacuum condensation, and biaxial stretching. In this way, the Mylar is used as the diaphragm, and the diaphragm has advantages of not being easily deformed and having good hardness, thereby avoiding an undesirable phenomenon such as deviation of a location of the abutting member.

Based on any one of the first to the third implementations of the first aspect, embodiments of this application further provide a fourth implementation of the first aspect: The abutting member is foam. The foam is a material made of foamed plastic particles, and has advantages of a light weight, good elasticity, and a thin size. The foam can better abut against the optical module without causing damage to the optical module or affecting a thickness of the electronic device.

Based on any one of the first aspect, or the first to the fourth implementations of the first aspect, embodiments of this application further provide a fifth implementation of the first aspect: Each frame portion of the frame body further includes a connecting wall fixedly connected to an inner side edge of the rear frame wall, and the connecting wall is configured to fixedly connect to the backboard of the electronic device.

In other words, each frame portion of the frame body further includes a connecting wall that is fixedly connected to a side edge that is of the second frame wall and that is close to the center of the electronic device, and the connecting wall is configured to fixedly connect to the backboard of the electronic device.

In this way, a groove structure formed by the front frame wall, the rear frame wall, and the side frame wall of the frame body can directly cooperate with the backboard, no fastening structure needs to be disposed between the backboard and the groove structure, and the frame body can limit deformation of the backboard to some extent.

Based on the fifth implementation of the first aspect, embodiments of this application further provide a sixth implementation of the first aspect: Connecting walls of the first frame portion and the second frame portion of the frame body each include a first wall and a second wall, the first wall is fixedly connected to the rear frame wall of the corresponding frame portion by using the second wall, a distance between the first wall and the screen is greater than a distance between the rear frame wall and the screen, and the first wall is away from the side frame wall of the corresponding frame portion relative to the rear frame wall.

In other words, connecting walls of the first frame portion and the second frame portion of the frame body each includes a first wall and a second wall, the first wall is fixedly connected to the second frame wall of the frame portion by using the second wall, the first wall is away from the first frame wall relative to the second frame wall, and the first wall is away from the third frame wall relative to the second frame wall.

Based on the fifth implementation of the first aspect, embodiments of this application further provide a seventh implementation of the first aspect: The connecting wall of the third frame portion of the frame body includes an extending wall extending inwards from the inner side edge of the rear frame wall of the third frame portion.

In other words, the connecting wall of the third frame portion of the frame body includes an extending wall extending towards the center direction of the electronic device from a side edge that is of the second frame wall of the third frame portion and that is close to the center of the electronic device.

Based on any one of the first aspect, or the first to the seventh implementations of the first aspect, embodiments of this application further provide an eighth implementation of the first aspect. The frame body is of an integrally formed structure. In this way, a connection structure can be avoided from being disposed between adjacent frame portions of the frame body, so that strength of the frame body can be improved while a structure is simplified.

Based on any one of the first aspect, or the first to the eighth implementations of the first aspect, embodiments of this application further provide a ninth implementation of the first aspect: The electronic device further includes a rear housing, the rear housing is fastened to the frame body, and an edge of the rear housing abuts against the rear frame wall of the frame body.

In other words, the electronic device further includes a housing member, the housing member is fastened to the frame body, and an edge of the housing member abuts against the second frame wall of the frame body.

In this way, the backboard of the electronic device can be prevented from being exposed, and the rear frame wall, the side frame wall, and the branch wall of the frame body of the middle frame are used as appearance surfaces of the electronic device, that is, exposed surfaces or visible surfaces in a normal use state. This facilitates surface processing on each appearance surface, and is not limited.

A second aspect of embodiments of this application provides a method for assembling an electronic device. The electronic device includes a screen, a backboard, a middle frame, and an optical module. The middle frame includes a frame body, the frame body is of a frame structure with an opening on one side, and the frame body includes three frame portions. A first frame portion and a second frame portion are disposed in parallel, and same-side ends of the first frame portion and the second frame portion are fixedly connected by using a third frame portion. Each frame portion of the frame body includes a front frame wall, a rear frame wall, and a side frame wall. An outer side edge of the front frame wall is fixedly connected to an outer side edge of the rear frame wall by using the side frame wall, and the outer side edge of the front frame wall is fixedly connected to a branch wall extending forwards. In this way, a groove structure with an opening facing inwards is formed between the front frame wall, the rear frame wall, and the side frame wall of each frame portion of the frame body.

The method for assembling an electronic device includes: assembling the optical module and the backboard; installing the assembled optical module and backboard into the frame body from the opening side of the frame body, so that edges of the optical module and the backboard are inserted between a front frame wall and a rear frame wall of a corresponding frame portion, and fastening the backboard and the rear frame wall, where during assembly, the backboard is close to the rear frame wall of the frame body, and the optical module is close to the front frame wall; and after the backboard and the rear frame wall of the frame body are fastened, embedding the screen in an area enclosed by three branch walls of the frame body, and fastening the screen to three front frame walls of the frame body.

According to the assembly method, a drawer-like drawing and inserting assembly manner is used between the backboard assembled with the optical module and the frame body, so that assembly is simple and quick, and assembly time can be shortened.

Based on the second aspect, embodiments of this application further provide a first implementation of the second aspect: The electronic device includes a flexible diaphragm and an elastic abutting member, the abutting member is fixedly connected to a second part of the diaphragm, and a side edge that is of the backboard and that corresponds to a location of at least one frame portion has a front-facing folding edge. Before the backboard and the frame body are assembled, the diaphragm is further fixedly connected to each folding edge of the backboard, and a first part of the diaphragm is fixedly connected to an outer surface of the folding edge, where the abutting member faces a side on which the optical module is located, that is, a surface on which the diaphragm is fixedly connected to the folding edge is a same surface as a surface on which the diaphragm is fixedly connected to the abutting member. The second part of the diaphragm is bent towards the side on which the optical module is located, so that the abutting member can abut against the optical module. Then, the backboard assembled with the diaphragm and the optical module is assembled with the frame body. During assembly, the second part of the diaphragm is pressed towards the optical module by using the front frame wall of the frame portion at the corresponding location.

In this way, during assembly, the front frame wall of the frame body is moved relative to the backboard and the optical module, to press the second part of the diaphragm towards the optical module, and limit a relative location of the second part of the diaphragm, so that the abutting member fastened to the second part of the diaphragm can abut against the optical module, to prevent the optical module from jumping off. In this assembly manner, the abutting member has only an abutting action towards the optical module, and there is no friction and movement between the abutting member and the optical module, which can prevent the abutting member from scratching the optical module. In addition, the abutting member and the backboard are relatively fastened by using the diaphragm, and no interference is caused to the frame body during assembly, thereby avoiding a problem that the abutting member falls off in the assembly process.

DESCRIPTION OF EMBODIMENTS

Embodiments of this application provide an electronic device and a method for assembling an electronic device. The electronic device may be any terminal product having a screen.

Figure 1:
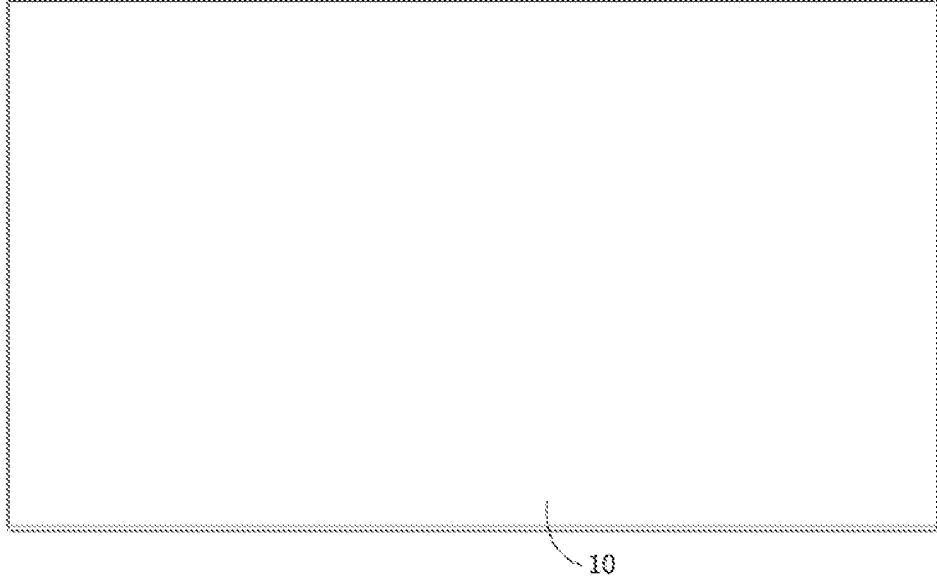
FIG. 1 is a main view of an electronic device according to an embodiment of this application.
Figure 2:
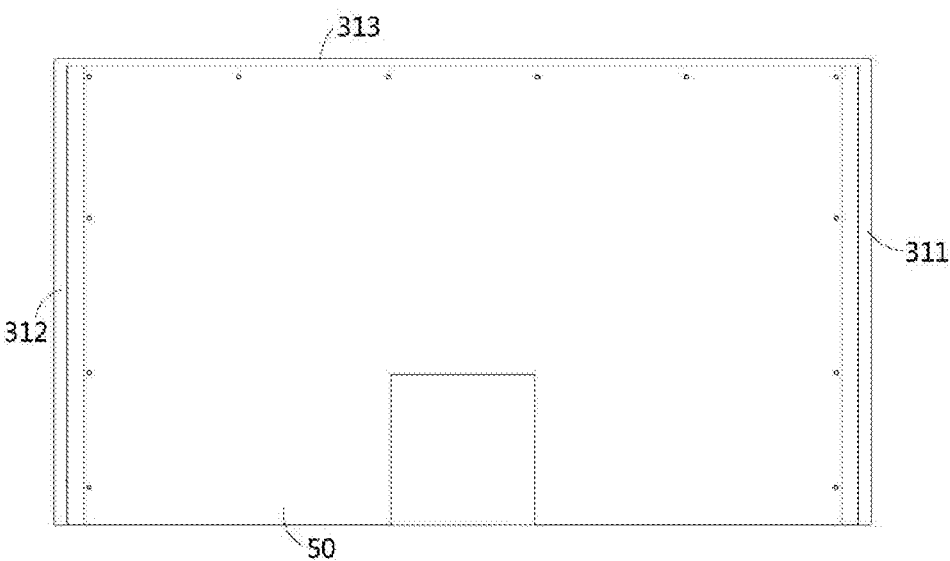
FIG. 2 is a rear view of the electronic device shown in FIG. 1.
Figure 3:
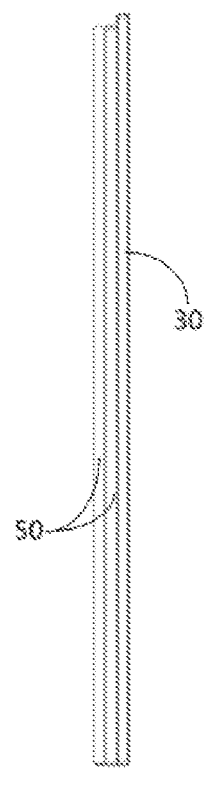
FIG. 3 is a left view of the electronic device shown in FIG. 1.

An embodiment of this application provides an electronic device. As shown in FIG. 1, the electronic device includes a screen 10. As shown in FIG. 2 and FIG. 3, the electronic device further includes a middle frame 30 and a rear housing 50 opposite to the screen 10. From a rear view angle shown in FIG. 2, the rear housing 50 and a left frame portion 311, a right frame portion 312, and a sky-side frame portion 313 of the middle frame 30 are visible. The middle frame 30 is a square-shaped frame structure as a whole, and is relatively fastened to the rear housing 50. The screen 10 is located on a front side of the middle frame 30. The middle frame 30, the rear housing 50, and the screen 10 enclose space for accommodating components such as a backboard 20 and an optical module 40 (not shown) of the electronic device.

Figure 6:
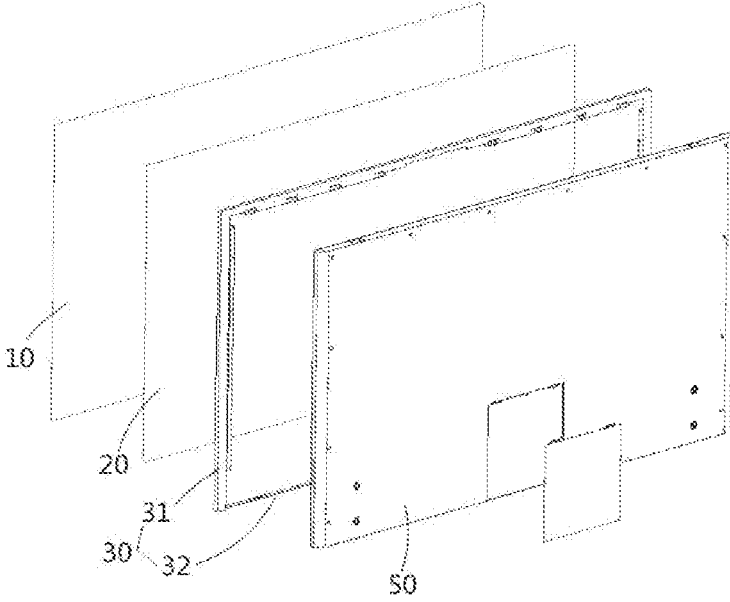
FIG. 6 is an exploded diagram of an electronic device according to an embodiment of this application.
Figure 7:
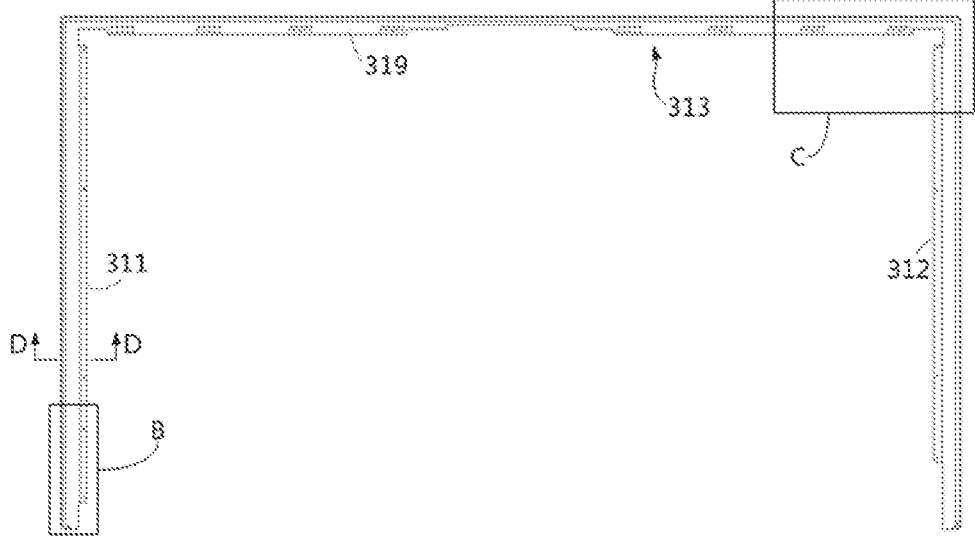
FIG. 7 is a main view of a frame body of a middle frame in FIG. 6.
Figure 10:
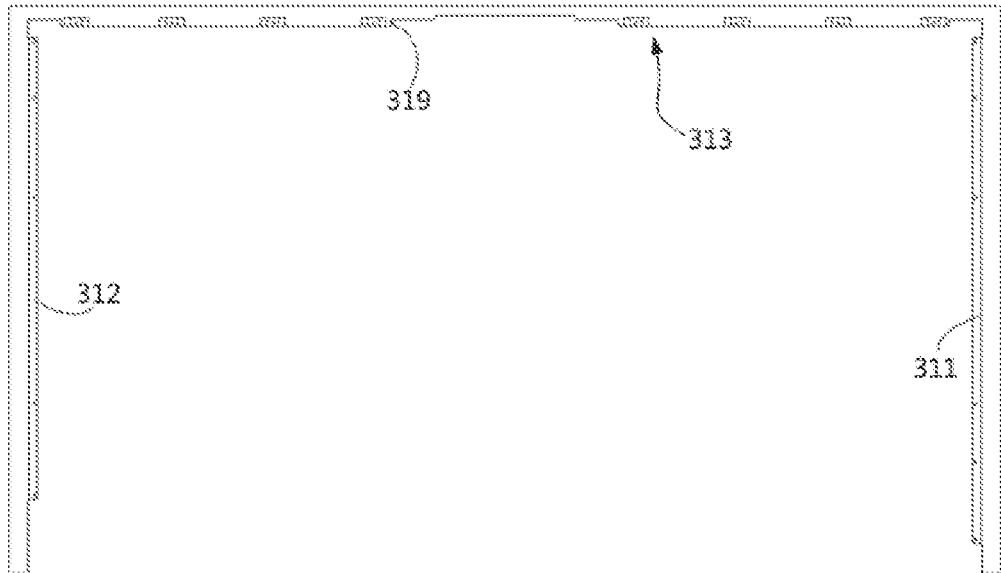
FIG. 10 is a rear view of a frame body shown in FIG. 7.

As shown in FIG. 6, the middle frame 30 of the electronic device includes a frame body 31 and a ground-side frame 32. With reference to FIG. 7 and FIG. 10, the frame body 31 is of a frame structure with an opening on one side, and includes three frame portions. For ease of description, the three frame portions are respectively referred to as the left frame portion 311, the right frame portion 312, and the sky-side frame portion 313. The left frame portion 311 and the right frame portion 312 are parallel to each other, the sky-side frame portion 313 is fixedly connected between a sky-side end of the left frame portion 311 and a sky-side end of the right frame portion 312, and the ground-side frame 32 may be fixedly connected between a ground-side end of the left frame portion 311 and a ground-side end of the right frame portion 312. In this way, the middle frame 30 is formed after the frame body 31 and the ground-side frame 32 are assembled.

It should be noted herein that, limitations of the foregoing orientation words are defined based on a reference that a user faces an electronic device in a normal use state. The left is a left side of the user, the right is a right side of the user, the sky side is a side close to the sky, that is, a top side, and the ground side is a side close to the ground, that is, a bottom side. Same orientation words in the following all have same understanding as the limitations herein. It may be understood that, use of these orientation words are merely for ease of description and understanding of the technical solutions, and does not constitute a limitation on the protection scope.

Figure 8:
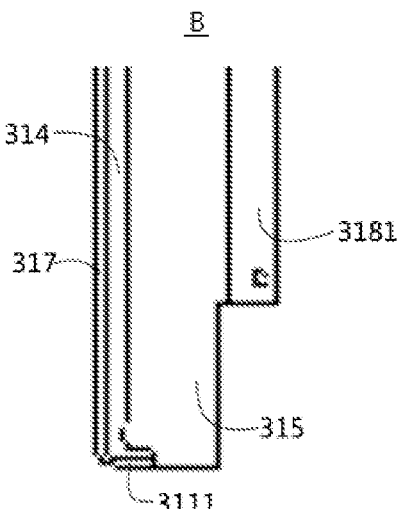
FIG. 8 is a schematic diagram obtained by partially amplifying a part B in FIG. 7.
Figure 9:
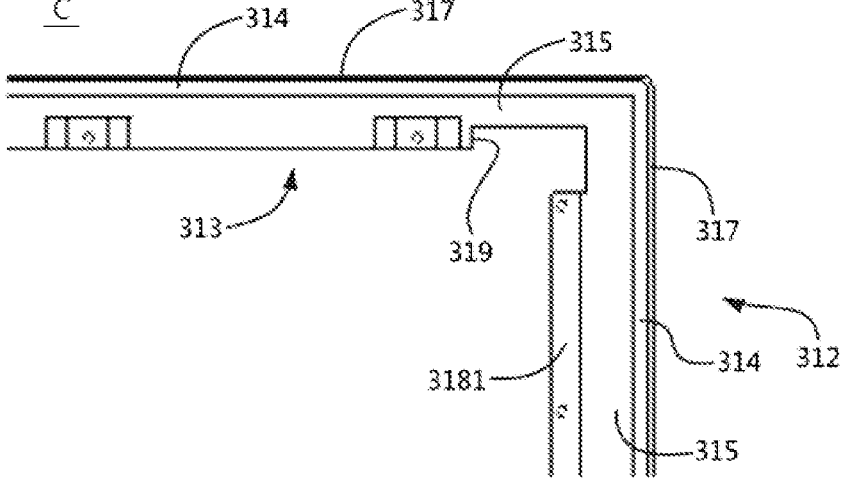
FIG. 9 is a schematic diagram obtained by partially amplifying a part C in FIG. 7.
Figure 11:
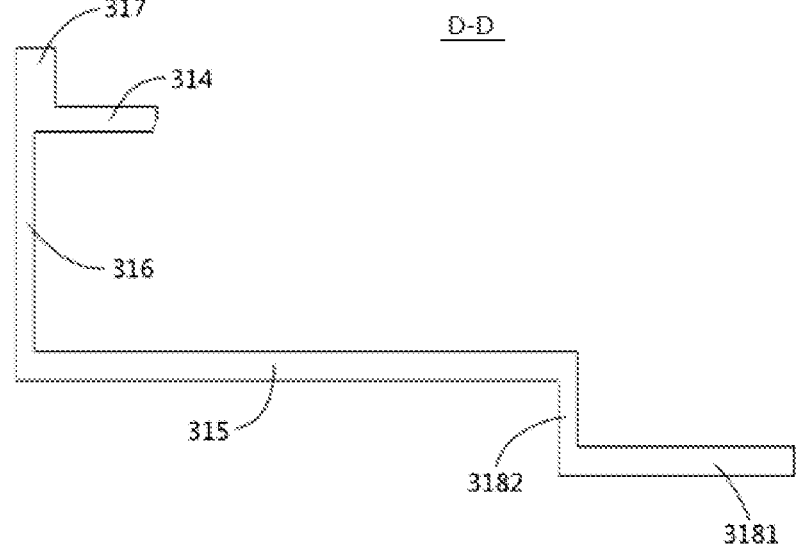
FIG. 11 is a schematic diagram of a cross section in a D-D direction in FIG. 7.

In this embodiment, main structural compositions of the three frame portions of the frame body 31 are consistent. Refer to FIG. 8, FIG. 9, and FIG. 11. Each frame portion includes a front frame wall 314, a rear frame wall 315, a side frame wall 316, and a branch wall 317. The side frame wall 316 is fixedly connected between an outer side edge of the front frame wall 314 and an outer side edge of the rear frame wall 315, so that the front frame wall 314, the rear frame wall 315, and the side frame wall 316 form a groove structure with an opening facing inwards. The branch wall 317 extends forwards from the outer side edge of the front frame wall 314, so that a step structure is formed between the branch wall 317 and the front frame wall 314.

To facilitate assembly of the ground-side frame 32, the left frame portion 311, and the right frame portion 312, as shown in FIG. 8, a bending portion 3111 bent towards a direction of the right frame portion 312 is disposed at the ground-side end of the left frame portion 311, to form a part connecting to the ground-side frame 32. Similarly, a bending structure bent towards a direction of the left frame portion 311 is disposed at the ground-side end of the right frame portion 312, to connect to the ground-side frame 32. In this embodiment, the left frame portion 311 and the right frame portion 312 are symmetrical structures.

It should be noted herein that, the foregoing orientation word "front" means a side close to the screen 10, and correspondingly, "rear" means a side away from the screen 10, that is, a side close to the rear housing 50, "inner" means a side close to a center of the screen 10, and correspondingly. "outer" means a side away from the center of the screen 10. Same orientation words in the following all have same understanding as the limitations herein. The use of these orientation words is also intended to facilitate description and understanding of the technical solution, and does not constitute a limitation on the protection scope.

Figure 12:
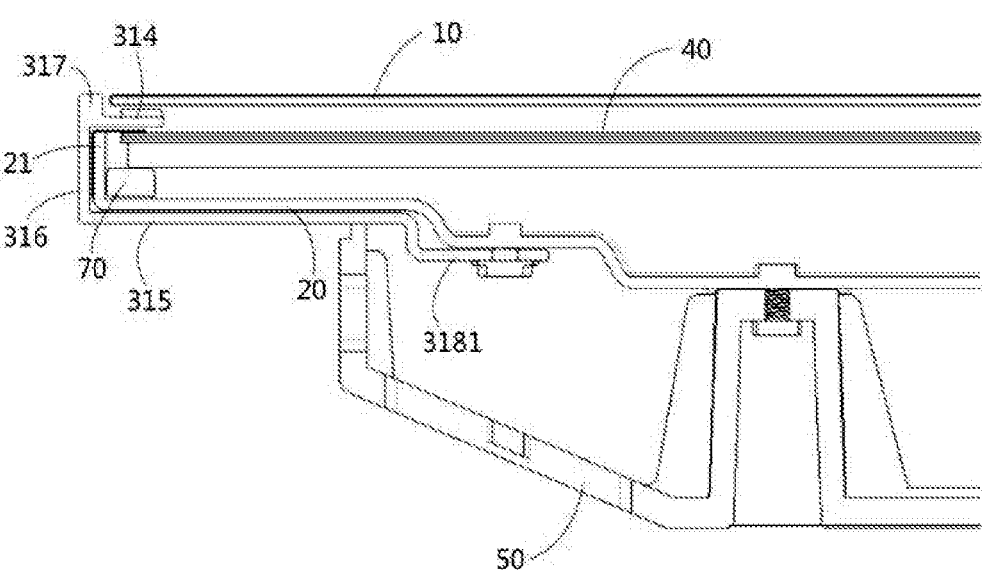
FIG. 12 is a schematic diagram of a partial cross section of an electronic device according to an embodiment of this application.
Figure 17:
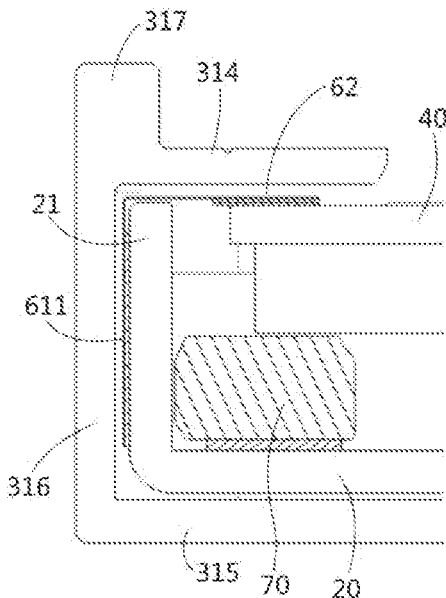
FIG. 17 is a schematic diagram of a cross section of an electronic device at a location of a frame portion according to an embodiment of this application.
Figure 18:
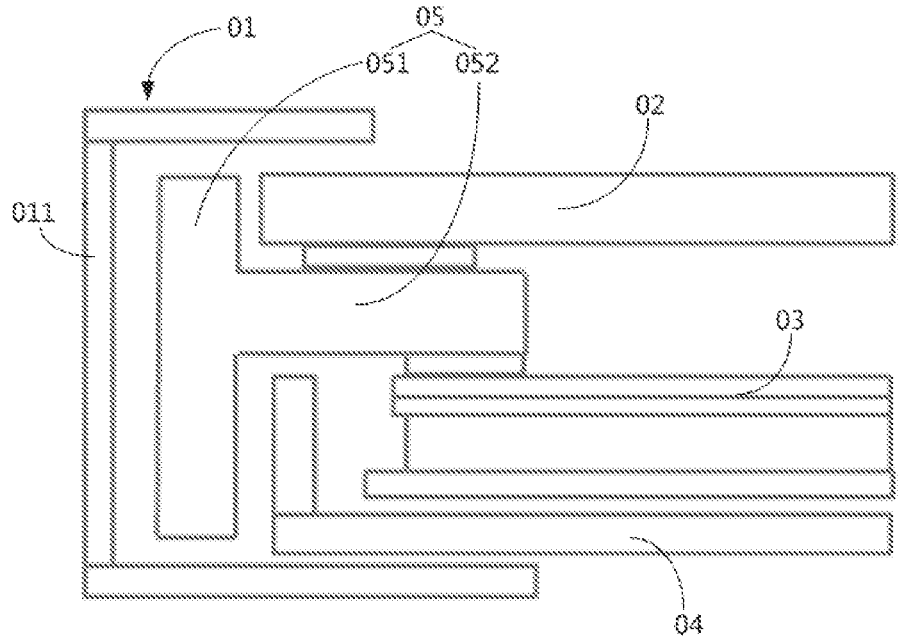
FIG. 18 is a schematic diagram of a cross section of an existing electronic device at a location of a middle frame.

Refer to FIG. 12 and FIG. 17 together. The optical module 40 of the electronic device is assembled with the backboard 20, and a plastic member 70 is fastened to a periphery of the backboard 20 to support and fasten the optical module 40. Specifically, the plastic member 70 may be fixedly connected to the backboard 20 through adhering by using an adhesive such as a back adhesive. The backboard 20 assembled with the optical module 40 is located between the front frame wall 314 and the rear frame wall 315 of the frame body 31, that is, left edges, sky-side edges, and right edges of the backboard 20 and the optical module 40 are respectively inserted into a groove structure of the left frame portion 311, a groove structure of the sky-side frame portion 313, and a groove structure of the right frame portion 312, so as to limit relative locations of the backboard 20 and related components fastened on the backboard 20. An edge of the backboard 20 is in contact with the rear frame wall 315 of the frame body 31, that is, the frame body 31 wraps the edge of the backboard 20. The optical module 40 is close to the front frame wall 314, and is located on a rear side of the front frame wall 314.

As shown in FIG. 12, a front surface of the front frame wall 314 of the frame body 31 is configured to support and fasten the screen 10, and the branch wall 317 of the frame body 31 is located on an outer side of an edge of the screen 10, that is, the branch wall 317 limits relative locations of the screen 10 and the frame body 31.

Through disposing of the foregoing structure of the middle frame 30 of the electronic device, the screen 10, the backboard 20, and the optical module 40 all can be directly assembled with the frame body 31 of the middle frame 30, and a transition structure is canceled, thereby simplifying a structure of the electronic device. In addition, the screen 10 is supported and fastened by the front frame wall 314 of the middle frame 30, and the branch wall 317 is located at the edge of the screen 10, so that a location of the screen 10 can be limited. A size of the branch wall 317 is not limited, and may be designed to be narrow, thereby resolving a problem that a size of a screen frame of an existing electronic device is large, and a development requirement of an electronic device without a frame can be met.

In this embodiment, in the three frame portions of the frame body 31, an elastic abutting member 62 is disposed between the front frame wall 314 of at least one frame portion and the optical module 40, to abut against the optical module 40. For understanding, refer to FIG. 17. Disposing of the abutting member 62 can prevent the optical module 40 from jumping off, and the elastic abutting member 62 can also have a cushion function. When the optical module 40 is accidentally impacted by external force, the abutting member 62 can protect the optical module 40 to prevent the optical module 40 from being damaged due to friction between the optical module 40 and the front frame wall 314.

To achieve a better limiting and protection function, the abutting member 62 is disposed between the front frame wall 314 of each of the three frame portions of the frame body 31 and the optical module 40. In this embodiment, the abutting member 62 is of a long strip structure extending along a corresponding edge of the optical module 40, which facilitates assembly. Certainly, in another embodiment, the abutting member 62 may alternatively be several block structures or strip structures that are arranged at intervals in a length direction of a corresponding edge of the optical module 40.

Figure 13:
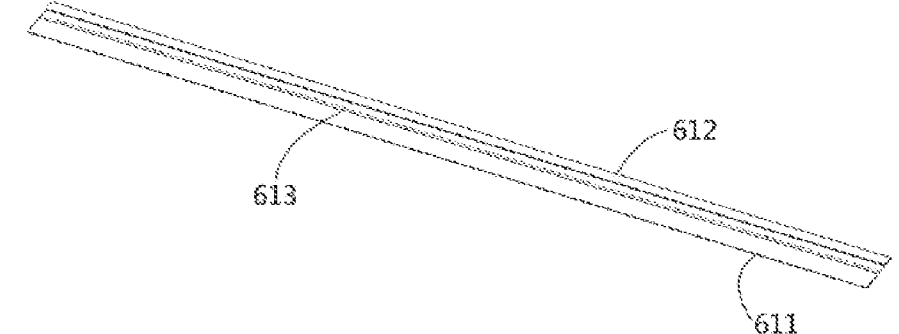
FIG. 13 is a schematic diagram of a structure of an abutting component of an electronic device according to an embodiment of this application.
Figure 14:
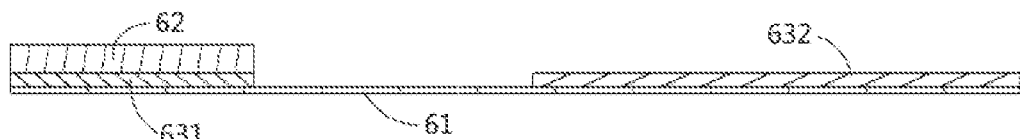
FIG. 14 is a schematic diagram of a cross section of the abutting component shown in FIG. 13.

Refer to FIG. 13 and FIG. 14 together. In this embodiment, for ease of assembly of the abutting member 62, a flexible diaphragm 61 is further disposed in the electronic device. For ease of description, one diaphragm 61 and one abutting member 62 fastened on the diaphragm 61 are referred to as one abutting component herein.

The diaphragm 61 is of a flexible structure, that is, the diaphragm 61 can be bent. The diaphragm 61 is of a strip structure with a length basically equivalent to a length of the front frame wall 314 of a corresponding frame portion. As shown in FIG. 13, the diaphragm 61 is divided into a first part 611 and a second part 612. With reference to FIG. 14, the abutting member 62 is fixedly connected to the second part 612 of the diaphragm 61. Specifically, the abutting member 62 may be fastened to the second part 612 of the diaphragm 61 through adhering by using a first back adhesive 631.

As shown in FIG. 17, a side edge that is of the backboard 20 and that corresponds to a frame portion has a folding edge 21 extending forwards, and the folding edge 21 is located between the front frame wall 314 and the rear frame wall 315 of the corresponding frame portion.

Figure 15:
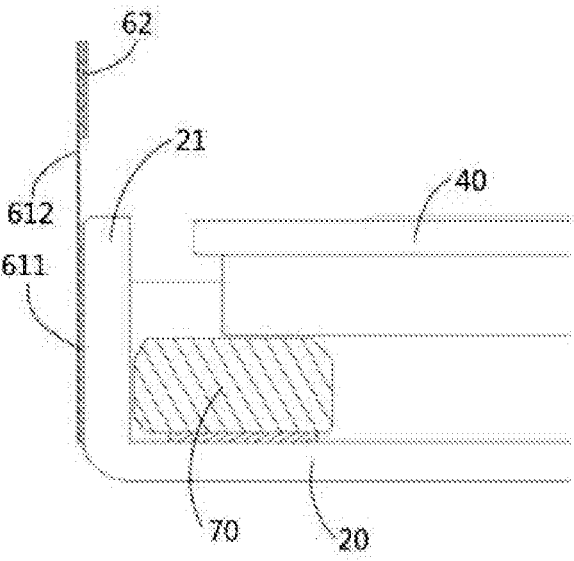
FIG. 15 is a schematic diagram of a structure obtained after a diaphragm of the abutting component shown in FIG. 13 is fastened to a backboard.
Figure 16:
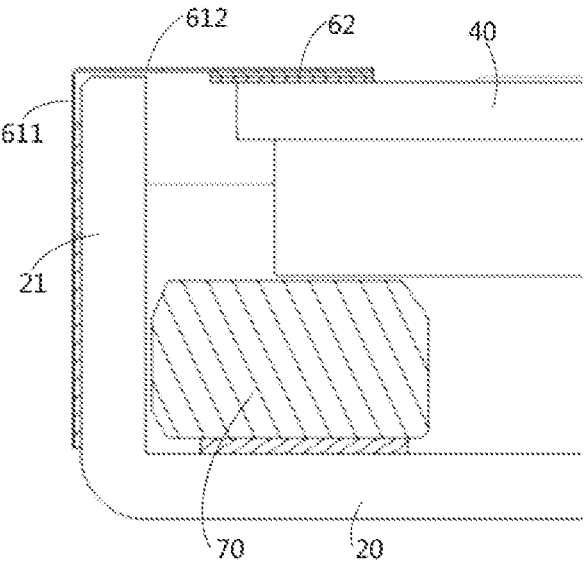
FIG. 16 is a schematic diagram of a structure formed by the abutting component, a backboard, and an optical module after the diaphragm of the abutting component in FIG. 15 is bent.

Refer to FIG. 15 and FIG. 16 together. When the abutting component is assembled and cooperates with the backboard 20 on which the optical module 40 is installed, as shown in FIG. 15, the first part 611 of the diaphragm 61 is first fixedly connected to an outer side surface (that is, a surface away from the optical module 40 or a surface close to the middle frame 30) of the folding edge 21. The surface on which the diaphragm 61 is fixedly connected to the folding edge 21 is a same surface as a surface on which the abutting member 62 is fastened on the diaphragm 61. In this way, after the diaphragm 61 is fastened to the folding edge 21 of the backboard 20, the abutting member 62 fastened on the diaphragm 61 faces a side of the optical module 40. Because the diaphragm 61 is flexible, the second part 612 of the diaphragm 61 can be bent, and the second part 612 of the diaphragm 61 is bent towards a direction of the optical module 40, so that the abutting member 62 fastened to the second part 612 of the diaphragm 61 can abut against the optical module 40, as shown in FIG. 16.

As shown in FIG. 13 and FIG. 14, the first part 611 of the diaphragm 61 may be fastened to the folding edge 21 through adhering by using a second back adhesive 632, which is convenient and reliable. Apparently, both the second back adhesive 632 and the abutting member 62 are located on a surface on a same side of the diaphragm 61.

It should be noted herein that, in an actual assembly process, after the second part of the diaphragm 61 is bent, because the diaphragm 61 is flexible, a state that is shown in FIG. 16 and in which the second part is completely attached to the optical module 40 may not be presented, and the second part of the diaphragm 61 may rebound. However, the bending operation facilitates subsequent assembly with the frame body 31.

After the structure shown in FIG. 16 and the frame body 31 are assembled, as shown in FIG. 17, in the electronic device, the first part 611 of the diaphragm 61 is abutted against by the side frame wall 316 of the frame body 31, and the second part 612 is abutted against by the front frame wall 314 of the frame body 31, to ensure that the abutting member 62 can abut against the optical module 40 and prevent the optical module 40 from jumping off.

In this embodiment, to reduce assembly difficulty, an identifier used to delimit the first part 611 and the second part 612 is disposed on the diaphragm 61. As shown in FIG. 13, the identifier may be specifically a folding line 613 extending in a length direction of the diaphragm 61. In this way, during assembly, the diaphragm 61 may be first pre-folded at a location of the folding line 613, and then the first part 611 of the diaphragm 61 is adhered to the folding edge 21 of the backboard 20, thereby improving assembly efficiency. As shown in FIG. 14, the pre-folding operation can ensure that the folding line 613 of the diaphragm 61 is aligned with a front surface of the folding edge 21, so as to ensure that after the second part 612 is bent, the abutting member 62 fastened to the second part 612 can abut against the optical module 40. The identifier in a form of the folding line 613 can ensure that the diaphragm 61 well cooperates with the folding edge 21 in an entire length direction of the diaphragm 61, thereby avoiding deflection or the like of the diaphragm 61 during adhering. Certainly, in another embodiment, in addition to the form of the folding line 613, the identifier may also be in another form. For example, at a folding location of the diaphragm 61, notches are disposed in the length direction of the diaphragm 61 at intervals of a specific distance, and the notch may be processed through blanking. Apparently, these notches are located on a straight line, and these notches arranged in a straight line direction form the identifier, which facilitates bending of the diaphragm 61.

In this embodiment, the diaphragm 61 is Mylar, and the Mylar (MYLAR) is a thin film, which may be a PET polyester thin film, and is a thin film formed by heating dimethyl terephthalate and ethylene glycol with assistance of a related catalyst, performing transesterification, vacuum condensation, and biaxial stretching. The Mylar has advantages of not being easily deformed and having good hardness, thereby avoiding an undesirable phenomenon such as deviation of a location of the abutting member 62. When the Mylar is used as the diaphragm 61, the identifier of the Mylar may be in the notch form. Because the Mylar has good hardness, disposing of the identifier in the notch form helps bend the Mylar. Certainly, in another embodiment, the diaphragm 61 may alternatively be another flexible thin film.

In this embodiment, the abutting member 62 is foam, and the foam is a material made of foamed plastic particles, and has advantages of a light weight, good elasticity, and a thin size. The foam can better abut against the optical module 40 without causing damage to the optical module 40 or affecting a thickness of the electronic device.

In this embodiment, each frame portion of the frame body 31 further includes a connecting wall fixedly connected to an inner side edge of the rear frame wall 315, and the connecting wall is configured to fixedly connect to the backboard 20 of the electronic device. In this way, a groove structure formed by the front frame wall 314, the rear frame wall 315, and the side frame wall 316 of each frame portion of the frame body 31 may directly cooperate with the backboard 20, and no fastening structure needs to be disposed between the backboard 20 and the groove structure. Structure disposing of the frame body 31 can limit deformation of the backboard 20 to some extent, thereby limiting deformation of the entire device to some extent.

Refer to FIG. 7 to FIG. 12. In this embodiment, connecting wall structures of the left frame portion 311 and the right frame portion 312 of the frame body 31 are the same, and each include a first wall 3181 and a second wall 3182. The first wall 3181 is connected to the rear frame wall 315 by using the second wall 3182, and the first wall 3181 is located on a rear side of the rear frame wall 315 of the corresponding frame portion, that is, a distance between the first wall 3181 and the screen 10 is greater than a distance between the rear frame wall 315 and the screen 10. In addition, the first wall 3181 is away from the side frame wall 316 relative to the rear frame wall 315, that is, the first wall 3181, the second wall 3182, and the rear frame wall 315 form a step structure. As shown in FIG. 12, the backboard 20 is also of a step structure at a corresponding location. Several mounting locations are provided on the first wall 3181 in a length direction (that is, a height direction of the electronic device), and a mounting location is also provided at a corresponding location on the backboard 20. The first wall 3181 and the backboard 20 may be fixedly connected by using a fastener such as a bolt or a screw.

Lengths of the connecting walls of the left frame portion 311 and the right frame portion 312 may be set to be smaller than a length of the frame portion, to avoid interference with a connection structure of the sky-side frame portion 313, a connection structure of the ground-side frame 32, or the like. Herein, both the length of the frame portion and the length of the connecting wall refer to a size in a direction from the sky-side frame portion 313 to the ground-side frame 32 (or a direction from the ground-side frame 32 to the sky-side frame portion 313), that is, a size in the height direction of the electronic device in a normal use state.

In this embodiment, as shown in FIG. 7, FIG. 9, and FIG. 10, a connecting wall structure of the sky-side frame portion 313 of the frame body 31 is an extending wall 319 extending inwards (that is, extending towards a direction of the ground-side frame 31) from an inner side edge of the rear frame wall 315 of the sky-side frame portion 313, that is, the extending wall 319 and the rear frame wall 315 are located in a same plane. Several mounting locations are disposed in a length direction of the extending wall 319 to fixedly connect to the backboard 20. It may be understood that the extending wall 319 is a part of the sky-side frame portion 313.

A specific quantity of "several" mentioned above is not limited, and may be one or more than two.

In another embodiment, the connecting walls of the left frame portion 311 and the right frame portion 312 each may alternatively be of a structure similar to the extending wall 319 of the sky-side frame portion 313.

Figure 4:
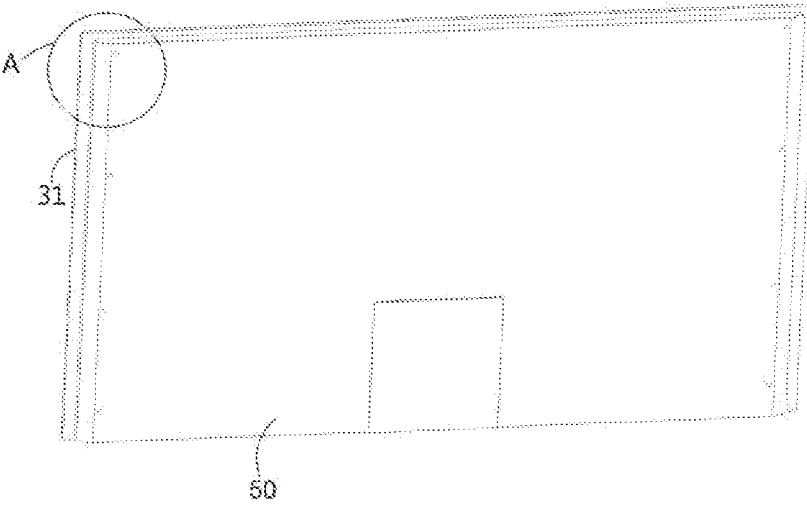
FIG. 4 is a schematic diagram of an electronic device on an axis side according to an embodiment of this application.
Figure 5:
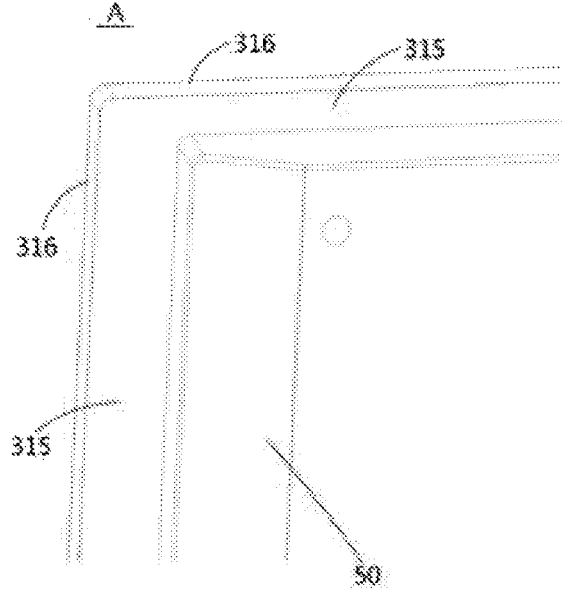
FIG. 5 is a schematic diagram obtained by partially amplifying a part A in FIG. 4.

With reference to FIG. 4, FIG. 5, and FIG. 12, in this embodiment, the rear housing 50 of the electronic device is fastened to the frame body 31, and an edge of the rear housing 50 abuts against the rear frame wall 315 of the frame body 31. In this way, after the rear housing 50 cooperates with the middle frame 30, the backboard 20 of the electronic device is built-in without a slot, and there is no risk such as light leakage. As shown in FIG. 12, the rear housing 50 and the backboard 20 are relatively fastened by using a fastener such as a bolt or a screw. In this way, the rear housing 50 and the middle frame 30 are relatively fastened. It may be understood that, accommodation space is further formed between the rear housing 50 and the backboard 20, and may be used to accommodate other components of the electronic device.

After the foregoing disposing is performed, the middle frame 30 and the rear housing 50 of the electronic device are appearance parts of the electronic device, that is, exposed parts or visible parts in a normal use state. An appearance surface of the middle frame 30 includes a rear surface of the rear frame wall 315, an outer surface of the side frame wall 316, and a front surface of the branch wall 317.

Generally, the front surface of the branch wall 317 is a surface that can be seen by a user frequently in a normal use state, and may be referred to as a level-1 surface or a level-A surface; the outer surface of the side frame wall 316 is a surface that can be seen by a user occasionally in a normal use state, and is referred to as a level-2 surface or a level-B surface; and the rear surface of the rear frame wall 315 is a surface that usually cannot be seen by a user, and may be referred to as a level-3 surface or a level-C surface.

In this way, different appearance processing may be performed on the level-1 surface, the level-2 surface, and the level-3 surface of the middle frame 30 based on a requirement, to achieve different visual effect. There is no need to consider impact caused to EMC (Electro-Magnetic Compatibility, electro-magnetic compatibility) electrostatic grounding effect, and an appearance processing manner for each level of surface is not limited.

In this embodiment, the frame body 31 is of an integrally formed structure, that is, the left frame portion 311, the right frame portion 312, and the sky-side frame portion 313 are integrally formed, so that a connection structure between adjacent frame portions can be avoided from being additionally disposed, thereby improving strength of the frame body 31 while simplifying a structure.

In actual application, a manner of integrally forming the frame body 31 is as follows; A rod-shaped member with a cross section shape shown in FIG. 11 is formed by using an extrusion process. A length of the rod-shaped member is determined based on a total length of the three frame portions of the frame body 31. Then, a bending slot is processed at a disposing location of the rod-shaped member or a material removal operation is performed at a bending location. It may be understood that there are four bending locations, which are respectively at a connection location between the left frame portion 311 and the sky-side frame portion 313, a connection location between the sky-side frame portion 313 and the right frame portion 312, the ground-side end of the left frame portion 311, and the ground-side end of the right frame portion 312. Next, the bending locations are sequentially bent, and bending slots at bending locations at sky-side ends are fastened through welding. Afterwards, a material removal operation is performed on the formed sky-side frame portion 313 based on a requirement to form the rear frame wall 315 and the extending wall 319 of the sky-side frame portion 313, as shown in FIG. 9. In addition, a material removal operation may also be performed on corresponding parts of the formed left frame portion 311 and right frame portion 312 based on a requirement.

Certainly, a cross section of the rod-shaped member formed in the extrusion process may alternatively have a shape obtained after the first wall 3181 and the second wall

3182 are removed in FIG. 11, that is, similar to a shape of an inverted F. Then, after a material removal operation is performed on a corresponding part, a bending operation is performed at locations corresponding to the left frame portion 311 and the right frame portion 312 to form shapes of the first wall 3181 and of the second wall 3182 shown in FIG. 11.

In addition, if a material for manufacturing the frame body 31 is not applicable to the extrusion process, the structure of the frame body 31 may alternatively be integrally formed through injection molding. This may be specifically selected based on an actual application requirement.

An embodiment of this application further provides a method for assembling an electronic device. The electronic device is the electronic device described in the foregoing embodiment, and details are not described herein again.

In this embodiment, the method for assembling an electronic device includes the following steps.

The optical module 40 and the backboard 20 are assembled together. A manner of assembling the optical module 40 and the backboard 20 is described above, and details are not described again.

The abutting component is fastened on the backboard 20 on which the optical module 40 is installed. A quantity of abutting components is determined based on an actual requirement, and an abutting component may be fastened on each of a left side edge, a right side edge, and a sky-side edge of the backboard 20. The first part 611 of the diaphragm 61 of the abutting component is fastened to the folding edge 21 of the backboard 20, the abutting member 62 fastened on the diaphragm 61 faces the optical module 40, and the second part 612 of the diaphragm 61 is bent towards a direction of the optical module 40. Specific manners of assembling the abutting component and fastening the abutting component to the folding edge 21 of the backboard 20 are also described above, and details are not described again.

The backboard 20 assembled with the optical module 40 and the abutting component is installed into the frame body 31 from an opening side (that is, an opening at a ground-side end) of the frame body 31, and during assembly, the front frame wall 314 presses the second part 612 of the diaphragm 61 towards the optical module 40. Specifically, the backboard 20 may not be moved, and the frame body 31 is moved towards a direction of the backboard 20; or the frame body 31 may not be moved, and the backboard 20 is moved towards a direction of the frame body 31. Because the frame body 31 has a groove structure that cooperates with the backboard 20, movement of the frame body 31 and the backboard 20 during assembly may be considered as drawer-like drawing and inserting movement, and the assembly is convenient. Then, the backboard 20 and the rear frame wall 315 of the frame body 31 are fastened.

After the backboard 20 and the frame body 31 are fastened, the screen 10 is embedded in an area enclosed by the branch walls 317 of the frame body 31, and is fastened to the front frame wall 314. Specifically, the screen 10 may be adhered to the front frame wall 314 by using back adhesive.

After the screen 10 and the frame body 31 are assembled, the ground-side frame 32 and the frame body 31 are assembled. Then, another component of the electronic device is installed on a rear side of the backboard 20. Finally, the rear housing 50 is fastened to the frame body 31, and the rear housing 50 is fastened to the backboard 20.

The assembly method is simple and fast. A structure of the abutting component is used, and the frame body 31 and the backboard 20 are assembled. In the assembly process, the front frame wall 314 of the frame body 31 presses, towards the optical module 40, the second part 612 that is of the diaphragm 61 and to which the abutting member 62 is fastened, and limits a location of the second part 612 of the diaphragm 61, so that after assembly, the abutting member 62 fastened to the second part 612 can better abut against the optical module 40, to prevent the optical module 40 from jumping off. During assembly, there is only a relative pressing action between the abutting member 62 and the optical module 40, and there is no friction and movement between the abutting member 62 and the optical module 40, so that the optical module 40 can be prevented from being scratched. In addition, no interference is generated between the frame body 31 and the abutting member 62 in the assembly process, thereby avoiding a problem that the abutting member 62 falls off during assembly.

It should be noted that, in the process of assembling the foregoing components, if the components do not affect each other, there is no necessary sequence.

The principle and the implementations of the present invention are illustrated by using specific examples in this specification. The foregoing description of the embodiments is merely intended to facilitate understanding of the methods and the core idea of the present invention. It should be noted that, a person of ordinary skill in the art may further make several improvements and modifications to the present invention without departing from the principle of the present invention, and the improvements and modifications also fall within the protection scope of the claims of the present invention.

What is claimed is:

1. An electronic device, comprising:

a screen;

an optical system;

a middle frame configured to accommodate the screen, wherein the middle frame comprises a frame body comprising:

a first frame portion;

a second frame portion; and a third frame portion coupled to the first frame portion and the second frame portion, wherein the first frame portion and the second frame portion are parallel to each other and perpendicular to the third frame portion, wherein each first frame portion, second frame portion and third frame portion comprises a front frame wall, a rear frame wall, a side frame wall, and a branch wall perpendicular to the front frame wall, disposed so that the optical system is located between the front frame wall and the rear frame wall, wherein an outer side edge of the front frame wall is connected to an outer side edge of the rear frame wall at the side frame wall, wherein the outer side edge of the front frame wall is connected to the branch wall, wherein a front surface of the front frame wall is configured to support the screen, and wherein the branch wall is located on an outer side of an edge of the screen; and a backboard configured to be assembled with the optical system and comprising:

a side edge comprising a folding edge extending perpendicular to and located between the front frame wall and the rear frame wall, and the folding edge comprising an outer side surface; and a diaphragm comprising a first part coupled to the outer side surface and a second part located between the front frame wall and the optical system.

2. The electronic device of claim 1, wherein the diaphragm further comprises an identifier for delimiting the first part and the second part.

3. The electronic device of claim 1, wherein the diaphragm is Mylar.

4. The electronic device of claim 2, wherein the diaphragm is Mylar.

5. The electronic device of claim 1, wherein the abutting member is foam.

6. The electronic device of claim 3, wherein the abutting member is foam.

7. The electronic device of claim 1, wherein each of the first frame portion, second frame portion and third frame portion further comprises a connecting wall of the rear frame wall configured to couple to the backboard.

8. The electronic device of claim 1, wherein the rear frame wall comprises an inner side edge, and wherein each of the first frame portion, second frame portion and third frame portion further comprises a connecting wall coupled to the inner side edge and configured to couple to the backboard.

9. The electronic device of claim 5, wherein the rear frame wall of each of the first frame portion, second frame portion and third frame portion further comprises a connecting wall configured to couple to the backboard.

10. The electronic device of claim 7, wherein each of the connecting walls of the first frame portion and the second frame portion comprises a first wall and a second wall, wherein the first wall is coupled to the rear frame wall of a corresponding frame portion at the second wall, wherein a first distance between the first wall and the screen is greater than a second distance between the rear frame wall and the screen, and wherein the first wall is located distal from the side frame wall of the corresponding frame portion relative to the rear frame wall.

11. The electronic device of claim 7, wherein the connecting wall of the third frame portion comprises an extending wall extending inwards from the inner side edge of the third frame portion.

12. The electronic device of claim 1, wherein the frame body is of an integrally formed structure.

13. The electronic device of claim 11, wherein the frame body is of an integrally formed structure.

14. The electronic device of claim 2, wherein the frame body is of an integrally formed structure.

15. The electronic device of claim 1, further comprising a rear housing, fastened to the frame body, and comprising a second edge that is configured to abut against the rear frame wall.

16. The electronic device of claim 1, further comprising a rear housing, fastened to the frame body, and comprising a third edge that is configured to abut against the rear frame wall.

17. The electronic device of claim 12, further comprising a rear housing, fastened to the frame body, and comprising a second edge that is configured to abut against the rear frame wall.

18. A method for assembling an electronic device, comprising:

assembling an optical system of the electronic device and a backboard;

installing the backboard into a frame body from an opening side of the frame body, wherein edges of both the optical system and the backboard are inserted between a front frame wall and a rear frame wall of a corresponding frame portion; fastening the backboard and the rear frame wall with the optical system proximate to the front frame wall and the backboard proximate to the rear frame wall; and after fastening the backboard and the rear frame wall:

embedding a screen in an area enclosed by branch walls perpendicular to the front frame wall; and fastening the screen on the on front frame walls of the frame body; and before assembling the backboard and the frame body, the method further comprises:

providing at least one frame portion with a front facing folding edge;

coupling a first part of a diaphragm to an outer surface of the folding edge; and pressing the second part of the diaphragm towards the optical system using the front frame wall of the frame portion at a corresponding location.

19. The electronic device of claim 1 further comprising an abutting member coupled to the second part and configured to face the optical system.

20. The method of claim 18, wherein before assembling the backboard and the frame body the method further comprises:

providing at least one frame portion with a front facing folding edge;

coupling a first part of a diaphragm to an outer surface of the folding edge;

providing an elastic abutting member positioned to face the optical system, wherein a second part of the diaphragm is bent towards the optical system abuts against the optical-system; and pressing the second part of the diaphragm towards the optical system using the front frame wall of the frame portion at a corresponding location.

* * * * *